United States Patent
Chin et al.

(10) Patent No.: US 11,411,393 B2
(45) Date of Patent: Aug. 9, 2022

(54) ULTRA-LOW CLAMPING VOLTAGE SURGE PROTECTION MODULE USING DEPLETION MODE MOSFET

(71) Applicant: Littelfuse, Inc., Chicago, IL (US)

(72) Inventors: Chuan Fang Chin, Taipei (TW); Teddy To, Tsuen Wan (HK)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/062,772

(22) Filed: Oct. 5, 2020

(65) Prior Publication Data

US 2022/0109296 A1 Apr. 7, 2022

(51) Int. Cl.
| | |
|---|---|
| *H02H 9/02* | (2006.01) |
| *H02H 9/00* | (2006.01) |
| *H02H 9/04* | (2006.01) |
| *H01L 27/02* | (2006.01) |

(52) U.S. Cl.
CPC .............. *H02H 9/02* (2013.01); *H02H 9/005* (2013.01); *H02H 9/046* (2013.01); *H01L 27/0266* (2013.01); *H02H 9/041* (2013.01); *H02H 9/045* (2013.01)

(58) Field of Classification Search
CPC .......... H02H 9/00; H02H 9/046; H02H 9/045; H02H 9/02; H02H 9/041; H02H 9/005; H02H 3/02; H01L 27/0266; H01L 27/0255; H01L 27/0262; H01L 27/0259; H01L 29/861; H01L 23/62
USPC .................................................. 361/117–120
See application file for complete search history.

(56) References Cited

U.S. PATENT DOCUMENTS

| | | | |
|---|---|---|---|
| 5,654,574 A | 8/1997 | Williams et al. | |
| 6,927,958 B2 * | 8/2005 | Nostrand | G01F 23/0084 361/58 |
| 10,692,854 B2 | 6/2020 | Rose et al. | |
| 2012/0194953 A1 * | 8/2012 | Mikolajczak | H02H 9/046 361/56 |
| 2014/0268470 A1 * | 9/2014 | Sapak | G02F 1/133308 361/118 |
| 2018/0286854 A1 * | 10/2018 | Rose | H01C 7/12 |
| 2018/0337529 A1 * | 11/2018 | O'Donnell | H02H 9/02 |
| 2020/0259326 A1 * | 8/2020 | Worley | H02H 9/046 |
| 2021/0226444 A1 * | 7/2021 | Fang | H03K 17/0822 |

FOREIGN PATENT DOCUMENTS

DE 102011050420 B3 11/2012

OTHER PUBLICATIONS

Extended European Search Report for EP21200048.3, dated Mar. 3, 2022.

* cited by examiner

*Primary Examiner* — Danny Nguyen
(74) *Attorney, Agent, or Firm* — KDB Firm PLLC

(57) ABSTRACT

An ultra-low clamping voltage Surge Protection Module (SPM) is disclosed which utilizes a depletion mode MOSFET (D MOSFET). The SPM may be part of a circuit or a device and includes a primary protection stage and a secondary protection stage, with the D MOSFET being connected between the two stages. The SPM may include a single D MOSFET, dual D MOSFETs, or multiple D MOSFETs and the primary and secondary protection stages may be implemented with a number of different components. The SPM using D MOSFET(s) exhibits improved surge protection over circuits using inductors.

18 Claims, 14 Drawing Sheets

ULTRA-LOW CLAMPING VOLTAGE SURGE PROTECTION MODULE USING DEPLETION MODE MOSFET

FIELD OF THE DISCLOSURE

Embodiments of the present disclosure relate to surge protection of circuits and, more particularly, to a technique for surge protection using depletion mode MOSFETs.

BACKGROUND

Surge Protection Modules (SPM), which are composed of protective components in different topologies, are regarded as effective means to clamp and divert external surge transients going into a system to be protected. SPMs can also be constructed with multi-stage protectors for electrical surges or transient voltage events. The SPM may have primary protection, secondary protection, and even tertiary protection components. These protection modules adopt either overcurrent protection components like fuses and Positive Temperature Coefficient devices (PTCs), or overvoltage protection components like Gas Discharge Tubes (GDTs) and Metal Oxide Varistors (MOVs). Inductors or Common-mode chokes are commonly placed between the primary and secondary protection components of the SPM.

Electronic systems or devices are particularly susceptible to surge events such as lightning surges, induced surge from other power lines and systems, inductive load on-off switching, power line crossing, and so on. It is challenging to design a protection module which allow normal operating powers or signals while suppressing or diverting those unwanted over voltage spikes or currents.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a circuit to provide overcurrent protection is disclosed. The circuit consists of a primary protection device, a secondary protection device, and a depletion mode metal oxide semiconductor field effect transistor (D MOSFET). The primary protection device diverts to ground a first portion of an external surge transient coming into the circuit. The secondary protection device diverts a second portion to ground of the external surge transient coming into the circuit. The D MOSFET absorbs surge energy in between the primary protection device and the secondary protection device.

An exemplary embodiment of a device to be coupled to a circuit is disclosed. The device provides overcurrent protection to circuit elements within the circuit and consists of a primary protection device, a secondary protection device, and a D MOSFET. The primary protection device diverts to ground a first portion of an external surge transient coming into the circuit. The secondary protection device diverts a second portion to ground of the external surge transient coming into the circuit. The D MOSFET blocks residual surge of the external surge transient that is not fully suppressed by the primary protection device.

DETAILED DESCRIPTION

Figures 1A, 1B:
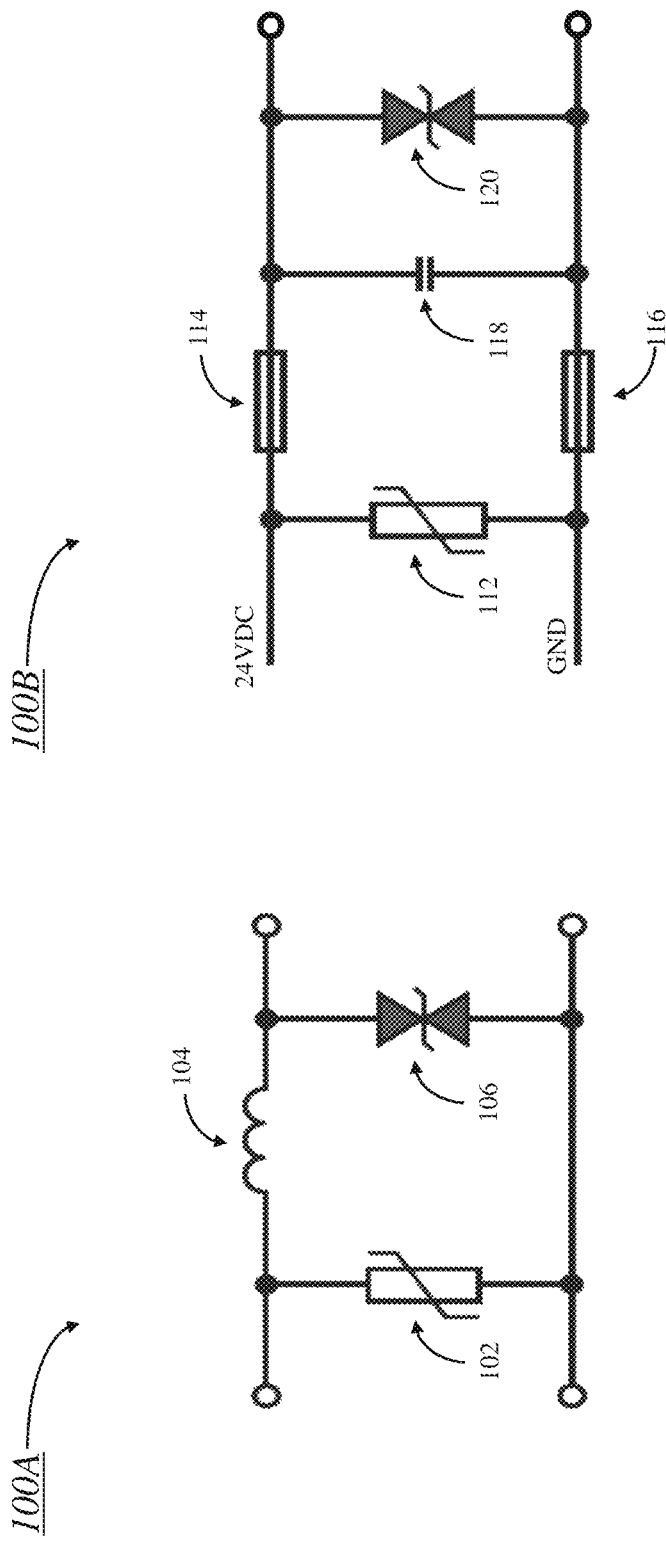
FIGS. 1A and 1B are representative drawings of SPM circuits, according to the prior art.

In accordance with the embodiments described herein, an ultra-low clamping voltage Surge Protection Module (SPM) is disclosed which utilizes one or more depletion mode MOSFETs (D MOSFETs). The SPM may be part of a circuit or a device and includes a primary protection stage and a secondary protection stage, with the D MOSFET(s) being connected between the two stages. The SPM may include a single D MOSFET, dual D MOSFETs, or multiple D MOSFETs and the primary and secondary protection stages may be implemented with a number of different components. The SPM using D MOSFET(s) exhibits improved surge protection over circuits using inductors.

Metal-Oxide Semiconductor Field-Effect Transistor devices, known as MOSFETs, are semiconductor devices used for switching and amplifying electronic signals in electronic devices. By adjusting a voltage on its gate, the width of a channel disposed between the source and drain of the MOSFET is varied. MOSFETs come in a variety of configurations, based on whether they are P-channel devices built with N-type substrates, N-channel devices built with P-type substrates, vertically disposed semiconductors, laterally disposed semiconductors, depletion mode, and enhancement mode.

In contrast to enhancement mode MOSFETs, which are turned on by the application of a voltage across the gate, depletion mode MOSFETs are known as "normally-on" devices when the gate terminal is at zero volts ($V_{GS}=0$ V). In addition to having a thin gate oxide between the source and drain regions, a conductive channel is formed beneath the gate oxide layer and between the source and drain regions using ion implantation. The concentration of active dopants in the substrate-to-channel region is used to adjust the threshold voltage (VTh) of the MOSFET to a desired value. Despite the name, many modern MOSFETs may be manufactured with a polysilicon gate, rather than metal, atop the insulating gate oxide.

A varistor is an electronic component with an electrical resistance that varies with the applied voltage. Varistors are used as control or compensation elements in circuits either to provide optimal operating conditions or to protect against excessive transient voltages. When used as protection devices, varistors shunt the current created by the excessive voltage away from sensitive components when triggered. Metal Oxide Varistors (MOVs) are one type of varistor made using sintered ceramic metal-oxide materials.

A Transient Voltage Suppression (TVS) diode is an electronic component used to protect electronics from voltage spikes induced on connected wires. TVS diodes operate by shunting excess current when the induced voltage exceeds an avalanche breakdown potential. The TVS diode is a clamping device, suppressing all overvoltages above its breakdown voltage. The TVS diode automatically resets when the overvoltage condition goes away, but absorbs much more of the transient energy internally than a similarly rated crowbar device.

A Gas Discharge Tube (GDT) is an overvoltage protection device that dissipates voltage transients through a contained plasma gas. One configuration of a GDT features a kind of ceramic tube sandwiched with metal electrodes and sealed with noble gas. GDTs are used to divert overvoltage when an external surge exceeds its sparkover voltage (working voltage) to a lower and save level. GDTs have high insulation resistance plus low capacitance and leakage to ensure minimal effect on normal operation of equipment. GDTs provide high voltage transient surge protection in small devices, are designed to dissipate large amounts of energy, for example, lightning surge protection, and are widely applied to outdoor telecom equipment, as one example. In general, the trigger/turn-on speed of a GDT device is much slower than that of semiconductor-based protectors like TVS diodes.

As described above, circuits known as Surge Protection Modules (SPMs) are composed of protective components in different topologies and are designed to clamp and divert external surge transients going into a system (components which are downstream from the SPM circuit). The SPM engage in "protection coordination" through use of different stages, e.g., primary protection, secondary protection, and tertiary protection. The protection coordination describes the "match" of different stages of protection components (including both overvoltage and overcurrent) to form a functional protection module.

FIGS. 1A and 1B are representative drawings of Surge Protection Module (SPM) circuits 100A and 100B, respectively, according to the prior art. The SPM circuit 100A (FIG. 1A) features a Metal Oxide Varistor (MOV) 102, an inductor 104, and a Transient Voltage Suppression (TVS) diode 106; thus, the SPM circuit 100A represents a MOV plus TVS combination. The MOV varistor provides the ability to withstand high energy while the TVS diode exhibits a low clamping voltage.

The SPM circuit 100B (FIG. 1B) features a MOV 112, two chokes 114, 116, a capacitor 118, and a TVS diode 120; thus, the SPM circuit 100B represents a MOV, plus choke, plus TVS combination. The SPM circuit 100B receives 24 VDC, and the MOV varistor 112 in this embodiment is a V33ZA70PX, manufactured by Littelfuse®, and is a special low voltage 20 mm diameter MOV (3KA @ 8/20 μsec (1 time)) while the TVS diode 120 may be any one of SMBJ or SMCJ series of TVS diodes, such as the SMBJ28A, the SMBJ30A, the SMCJ28A, or the SMCJ30A also manufactured by Littelfuse®.

The circuits 100A and 100B represent two different traditional designs for a Surge Protection Module. Inductors and common-mode chokes have been commonly used in between the primary protector device (the MOV or Gas Discharge Tube (GDT)) and the secondary protection device (the TVS diode). The circuit 100A has the inductor 104 between the MOV 102 (primary protection) and the TVS diode 106 (secondary protection). The circuit 100B has the chokes 114 and 116 between the MOV 112 (primary protection) and the TVS diode 120 (secondary protection). These circuits 100A and 100B are thus each used as a "low pass filter" by filtering all high speed or switching frequency spikes but allowing DC or low frequency AC to pass through the respective circuit.

As shown in the traditional SPM circuit 100A (FIG. 1A), following the primary protection device, the MOV 102 (which could alternatively be a GDT), the inductor 104 is sufficiently large to help block the residual surge not fully suppressed by the primary protection device. Having such a big inductor in the circuit 100A can cause other side effects, however, such as energy loss and high voltage spikes during fast transient events, etc. Further, the presence of such a large inductor can result in a significant let-through voltage and current to reach the secondary protectors (e.g., the TVS diode 106 in the circuit 100A), which necessitates a higher power TVS diode to clamp the big let-through voltage. Further, the inductor is a frequency-dependent component which performs well at a certain frequency band but may not work as well at other signal frequency ranges. Such conditions may exist especially when the circuit 100A is facing unanticipated external surge conditions, where it is difficult to predict the frequency and response time (or ramp up time versus decay time) of the surge waveforms.

Bi-Directional Design

Figure 2A:
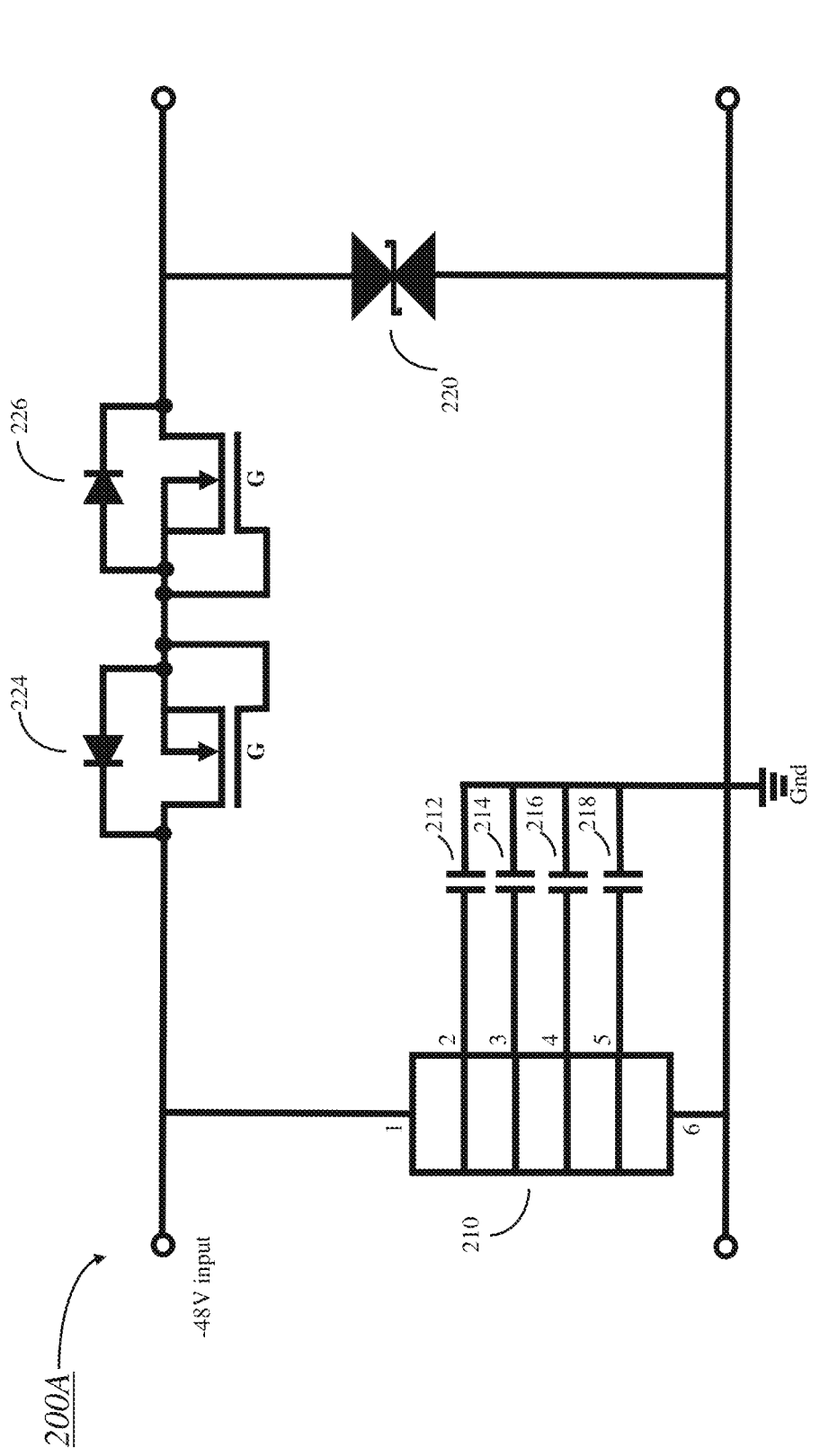
FIGS. 2A and 2B are representative drawings of novel SPM circuits, in accordance with exemplary embodiments.
Figure 2B:
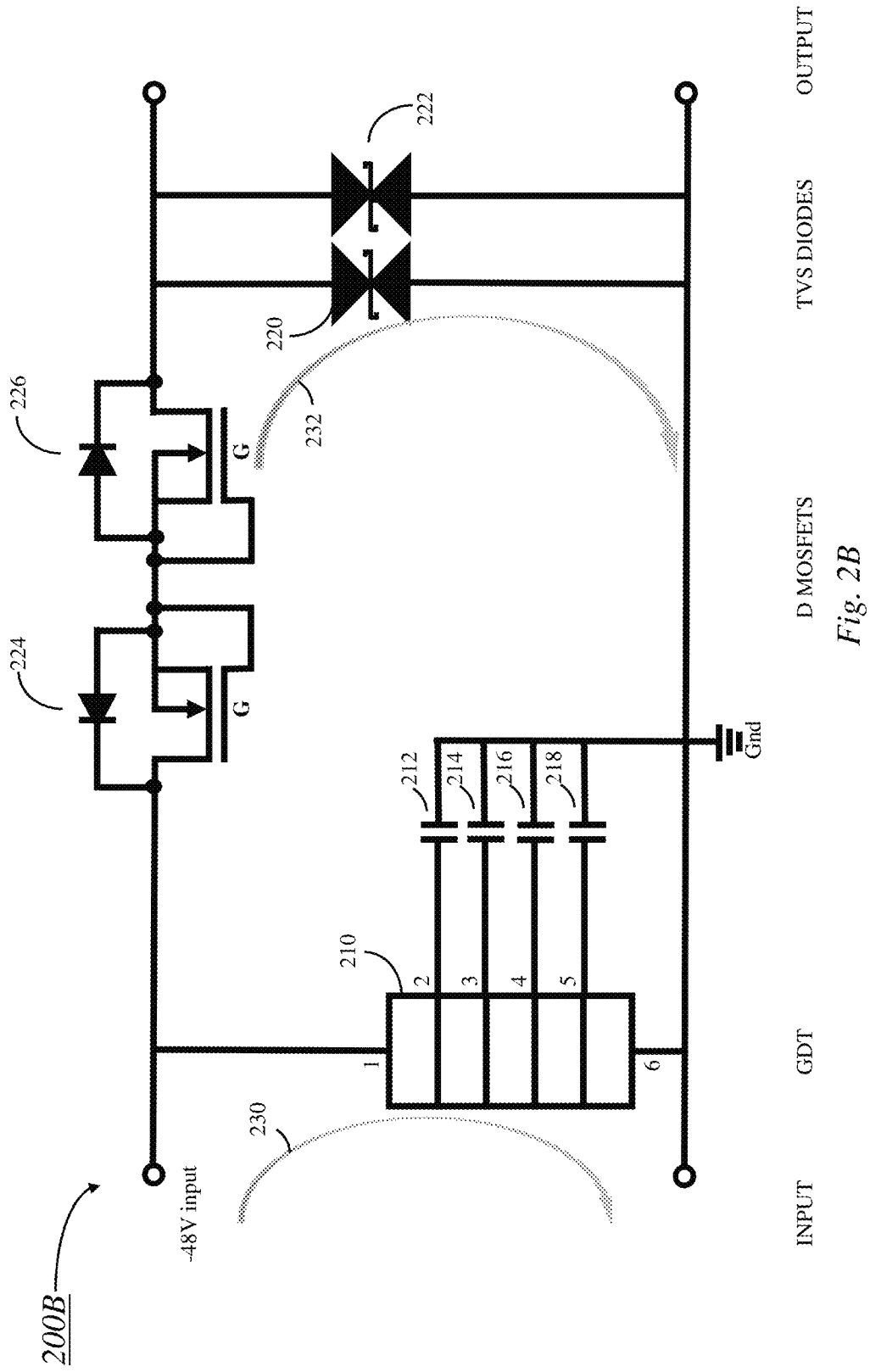

FIGS. 2A and 2B are representative drawings of novel SPM circuits 200A and 200B, respectively, in accordance with exemplary embodiments. The SPM circuit 200A includes a Gas Discharge Tube (GDT) 210 on the input side with four capacitors 212, 214, 216, and 218, followed by two D MOSFETs 224 and 226 and a single TVS diode 220. In one embodiment, the GDT 210 is a GDT DC60 device, manufactured by Littelfuse®. The numbers indicate the pinout assignment for the GDT DC60 component. Optionally, as illustrated in the circuit 200B (FIG. 2B), the TVS diode 220 is coupled with a second TVS diode 222. Hereinafter, reference to "SPM circuit 200" may mean either circuit 200A, with the single TVS diode 220, or circuit 200B, with the two TVS diodes 220 and 222. Thanks to the strong current-limiting/blocking characteristics of the D MOSFETs 224 and 226, the SPM circuit 200 thus provides an overall ultra-low clamping voltage that is not achievable using traditional methods in the market, in some embodiments, such as the SPM circuits 100A and 100B, above, which employ traditional methods, such as MOV or GDT devices as primary protectors, followed by inductors, and then second stage protectors in the circuits. Clamping voltage is a performance measurement of a surge protector's ability to attenuate a surge (reduce the surge to a manageable level). A surge protector that limits a 6000V surge so that only 600V is "visible" to the load would have a clamping voltage of 600V.

The D MOSFET is a normally on switch. With a source follower configuration, where the gate and source terminals of the D MOSFET are connected (shorted), the D MOSFET works as a current limiter with saturation mode. With the gate-to-source voltage, $V_{GS}$, going to negative with respect to its gate, the D MOSFET starts to pinch off to block voltage and current going through the D MOSFET switch. In exemplary embodiments, as disclosed herein, these characteristics of the D MOSFET make it suitable to provide surge protection.

In exemplary embodiments, the D MOSFETs 224 and 226 in the circuit 200 works to coordinate with the primary protecting GDT 210 and the secondary protecting TVS diodes 220 and 222 (or single secondary protecting TVS diode 220) to form a functional surge protection module. In one embodiment, the depletion mode MOSFETs 224 and 226 overcome the above-described deficiencies of the inductor 104 in FIG. 1A. In an exemplary embodiment, the circuit 200 uses two 1000V D MOSFETs 224 and 226, configured as illustrated in FIGS. 2A and 2B, to provide bi-directional protection.

Anti-Series Bi-directional Design

Figure 3:
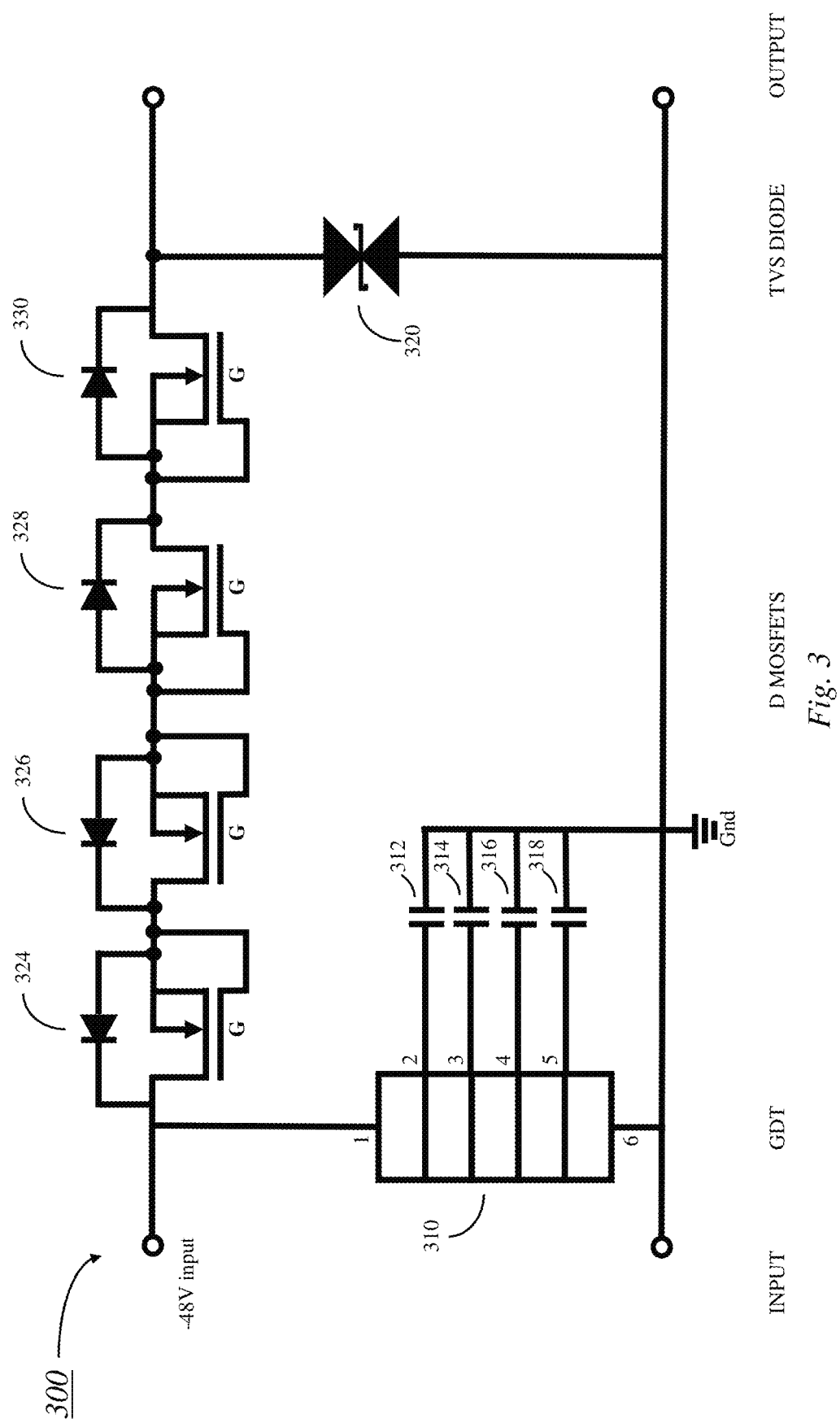
FIG. 3 is a representative drawing of a novel SPM circuit, in accordance with exemplary embodiments.

FIG. 3 is a representative drawing of a novel SPM circuit 300 for providing bi-directional protection, in accordance with exemplary embodiments. The SPM circuit 300 includes a GDT 310 on the input side with four capacitors 312, 314, 316, and 318, and a single TVS diode 320 (optionally, the circuit can have two TVS diodes. This time, the circuit 300 features four D MOSFETs 324, 326, 328, and 330, rather than two. The configuration of the four D MOSFETs 324, 326, 328, and 330 is known as "anti-series" connection because the current is able to flow in both directions and provides bi-directional protection. When the current flows from the left side of the circuit 300, the first D MOSFET 324 is forward biased in saturation mode whereas the second D MOSFET 326 is reverse biased. However, the body diode inside the second D MOSFET 326 is now in a forward bias direction and acts as a conduction path. The same principle applies when the current flows from the other direction. In an exemplary embodiment, the four D MOSFETs 324, 326, 328, and 330 are 500V MOSFETs.

Uni-Directional Design

Figure 4:
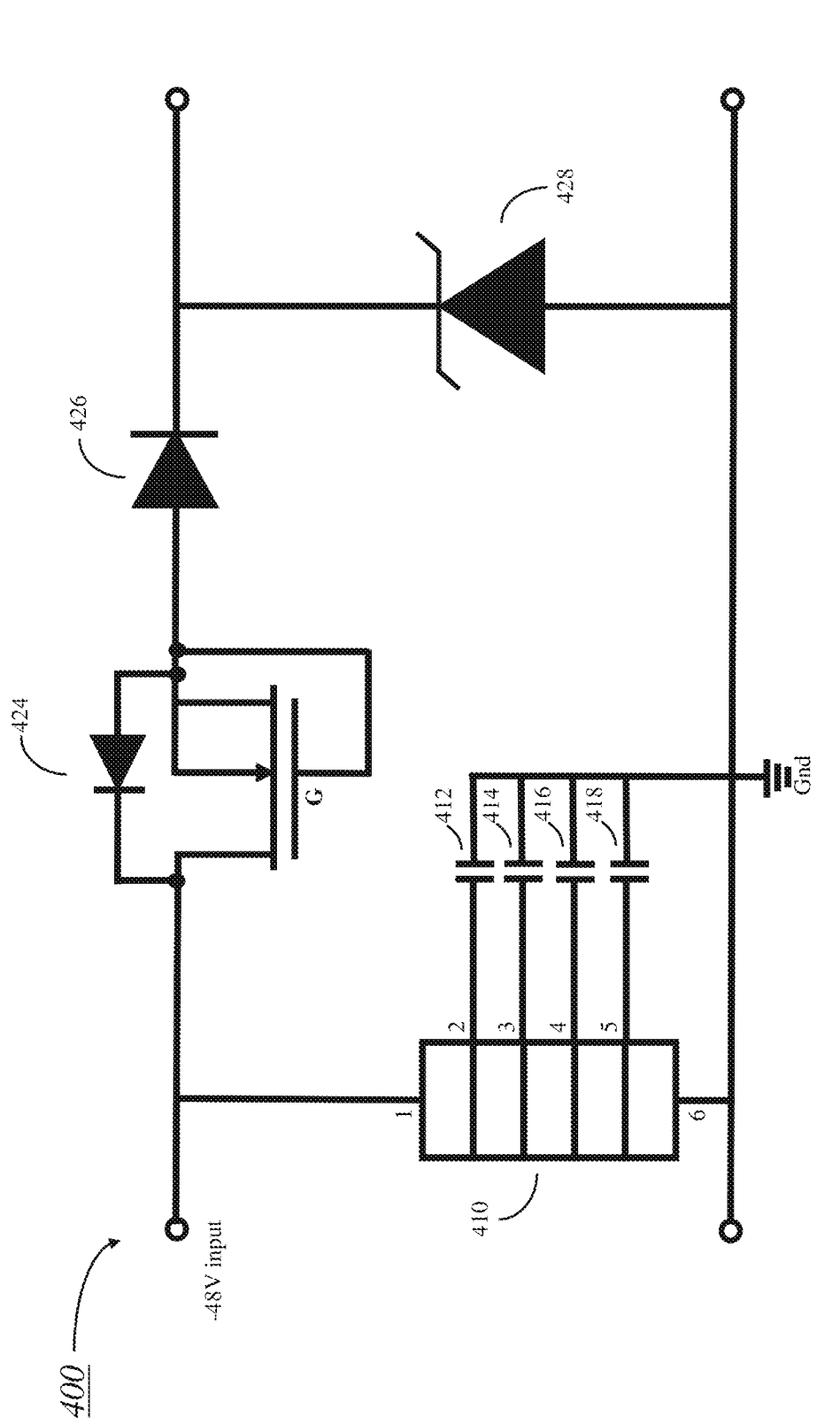
FIG. 4 is a representative drawing of a novel SPM circuit, in accordance with exemplary embodiments.

FIG. 4 is a representative drawing of a novel SPM circuit 400 for providing uni-directional protection, in accordance with exemplary embodiments. The circuit 400 features a GDT 410 with four capacitors 412, 414, 416, 418, a D MOSFET 424, a diode 426, and a TVS diode 428. In contrast to the circuits 200 and 300, the circuit 400 features fewer components having similar functions and, in some embodiments, is suitable for uni-directional surge protection. The SPM circuit 400 may provide protection, for example, for DC line protection, uni-signal transmission, and so on. In such environments, the simpler design of the SPM circuit 400 may be favored over the more complex design of the SPM circuits 200 or 300.

The various D MOSFET configurations shown herein thus disclose an innovative way to dramatically clamp down the let-through transient voltages to a much lower level before the voltage reaches the secondary protection portion of the respective circuits 200, 300, and 400. The circuit 200b of the bi-directional MOSFET design (FIG. 2B) (including both TVS diodes 224 and 226) was subjected to various tests to demonstrate the superior clamping performance of the surge protection module, in exemplary embodiments. Tests performed on the anti-series bi-directional circuit 300 and the uni-directional circuit 400 produce similarly promising results, in some embodiments.

Returning to FIG. 2B, to perform the testing of the circuit 200, the function of this module is to provide protection for a −48V telecom/server power supply. The GDT 210 is a GDT GD60:60V Sparkover voltage device, manufactured by Littelfuse®. The D MOSFETs 224 and 226 are IXTH16N100D2 (1000V, 10A, 1.3 ohm). The TVS diodes 224 and 226 are 20KPA60CA, with a standoff voltage of 60V and a 20 kW power rating, also manufactured by Littelfuse®. The circuit 200B (FIG. 2B) shows two arrows 230 and 232. The arrow 230 shows the primary protection provided by the GDT to clamp some of the surge current, so that the current goes to ground; the arrow 232 shows the secondary protection provided by the TVS diodes 220 and 222 to clamp additional surge current, with the MOSFETs 224 and 226 helping to absorb some surge energy not fully suppressed by the primary protection device, with the residual surge energy going to the TVS diodes 220, 222 for further clamping.

The tests results shown below are performed in the telecom/server power supply protection realm. However, the SPM circuit 200B may have a variety of different applications for providing surge protection, so these results are not meant to be limiting.

In exemplary embodiments, the following surge conditions were conducted to the SPM circuit 200B of FIG. 2B:

1. Surge test: 20 kA 8/20 waveform D MOSFET 500V
2. Surge test: 4 kA 10/350 waveform D MOSFET 500V
3. Surge test 20 kA 8/20 waveform by using D MOSFET 1000V
4. Surge test 4 kA 10/350 waveform by using D MOSFET 1000V
5. Continuous current, 48V, 3A test with 500V D MOSFET Further, the surge current/voltage waveform is measured 1) across the GDT 210 (DC60) and 2) across the TVS 220 and 222 (20KPA60CA), and captured in the below several response waveforms (FIGS. 5-8).

The circuit 200B of FIG. 2B provides an exemplary embodiment of the surge protection ideas disclosed herein. These tests may further be applied to the anti-series bi-directional circuit 300 (FIG. 3) and the uni-directional circuit 400 (FIG. 4). For example, the circuit 300 may use a GDT DC60 as the primary protector and four IXTH16N50D2 D MOSFETs (500V) connected in anti-series for current blocking in bidirectional mode. The two sets of D MOSFETs 324, 326, 328, and 330 are described herein as "anti-series" because the first two D MOSFETs 324 and 326 are in a forward bias position while the other two D MOSFETs 328 and 330 are in a reverse bias position. As used herein, a D MOSFET in reverse bias position means that the integrated body diode conducts current in a forward direction.

Figure 5:
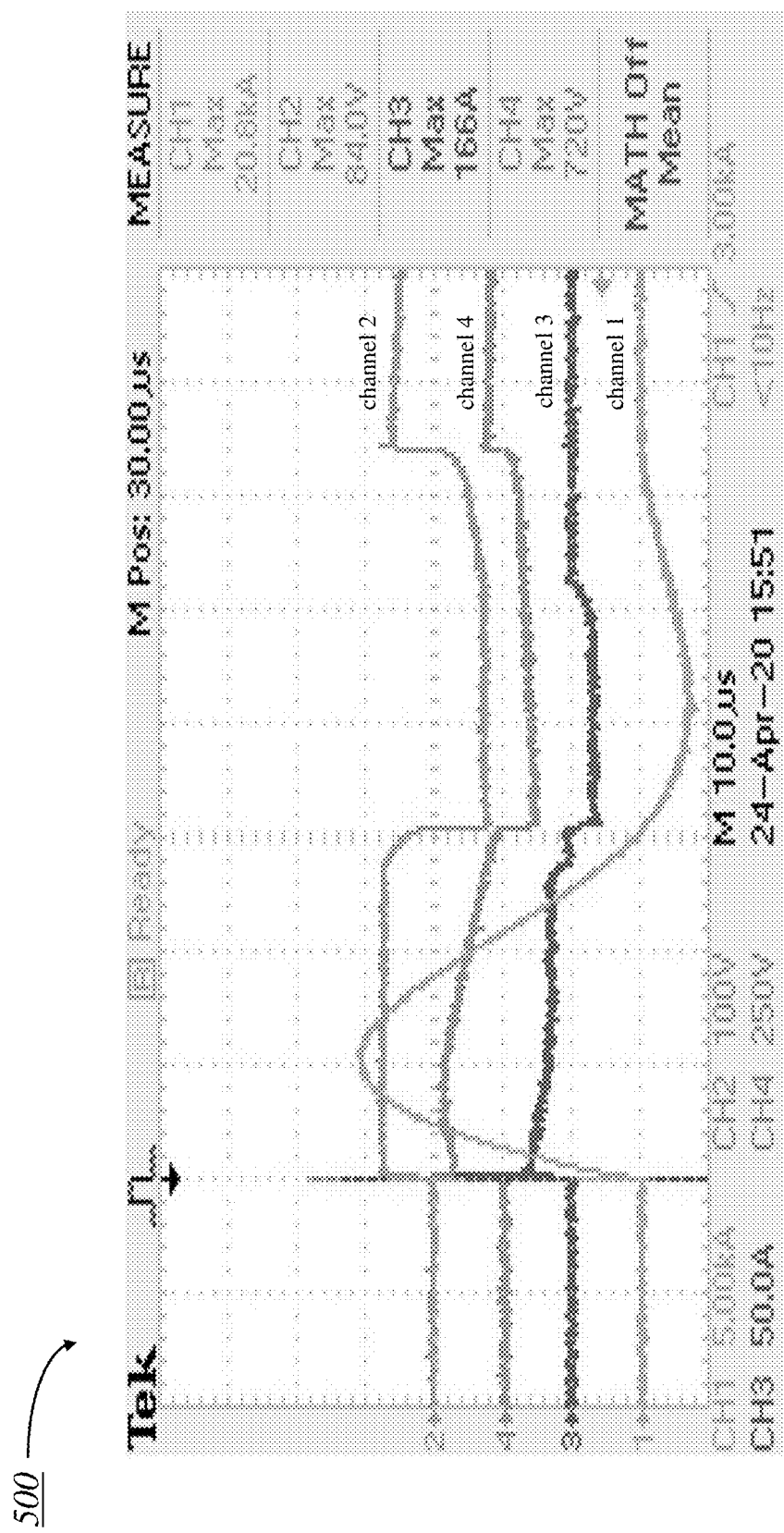
FIGS. 5-8 are response waveform for tests conducted on the circuit of FIG. 2B, in accordance with exemplary embodiments.

FIG. 5 is a response waveform 500 showing the surge test results for test 1 (20 kA 8/20 surge test) on the circuit 200B (FIG. 2B), in accordance with exemplary embodiments. Numbers on the left side of the waveform 500 denote the channels of the resulting waveforms produced (channels 1, 2, 3, and 4). Channel 1 shows the surge current through a DC60 GDT 210. Channel 2 shows the surge current through a 20KPA60CA TVS diode 220, with Vc=78V. Channel 3 shows the surge current through a 20KPA60CA (<30A) TVS diode 222. Channel 4 shows the voltage through the GDT 210 (200V).

Channel 1 indicates a very stressful fast surge waveform. The GDT 210 responds by taking away some surge energy and remaining let-through energy (see channel 4) is then further absorbed by the D MOSFETs 224 and 226. The first MOSFET 224 acts as the surge current absorber while the second MOSFET 226 conducts current by its body diode as explained before. By having two MOSFETs in the anti-series configuration, the circuit 200B is able to provide bi-directional surge protection. The resultant energy level is then accurately clamped down to 78V by the TVS diodes 220 and 222 (channel 2). The ultimate clamping voltage is 78V, which is a very low level, in some embodiments, given the surge current. The surge current level passing the TVS diodes 220 and 222 is relatively low (<30A, channel 3). In one embodiment, this first surge test demonstrates superior clamping characteristics even as the incoming surge current reaches up to 20 kA in this example. The clamping voltage was maintained at the same level no matter how high the incoming surge levels were, in exemplary embodiments.

Figure 6:
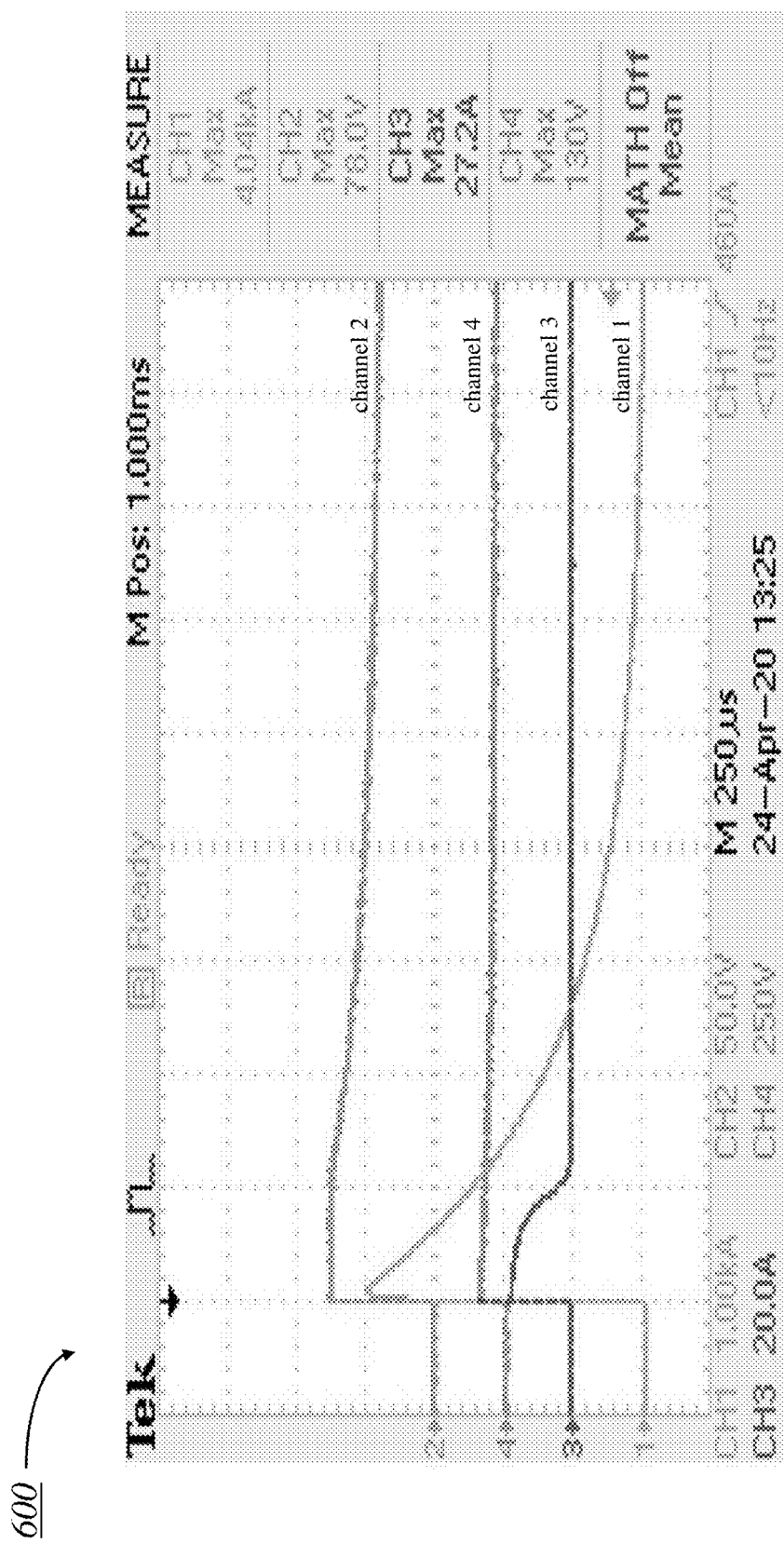

FIG. 6 is a response waveform 600 showing the surge test results for test 2 (4 kA 10/350 surge test) on the circuit 200B (FIG. 2B), in accordance with exemplary embodiments. Numbers on the left side of the waveform 600 denote the channels of the resulting waveforms produced (channels 1, 2, 3, and 4). Channel 1 shows the surge current through a DC60 GDT 210. Channel 2 shows the surge current through a 5KPA60CA TVS diode 220, with Vc=78V. Channel 3 shows the surge current through a 5KPA60CA (<20A) TVS diode 222. Channel 4 shows the voltage through the GDT 210 (130V).

As compared to the 8/20 surge test (waveform 600), the 10/350 surge test is regarded as a long and high energy surge waveform. Put another way, the 10/350 surge test is slower than the 8/20 surge test for some latest telecom equipment tests and compliance. As illustrated in the waveform 600 of FIG. 6, the anti-series D MOSFETs 224 and 226 absorb the let-through energy of the GDT 210 (channel 4), and the surge energy is further clamped by the TVS diodes 220 and 222 (channel 2). In one embodiment, the resultant clamping voltage stays at 78V (channel 2).

Figure 7:
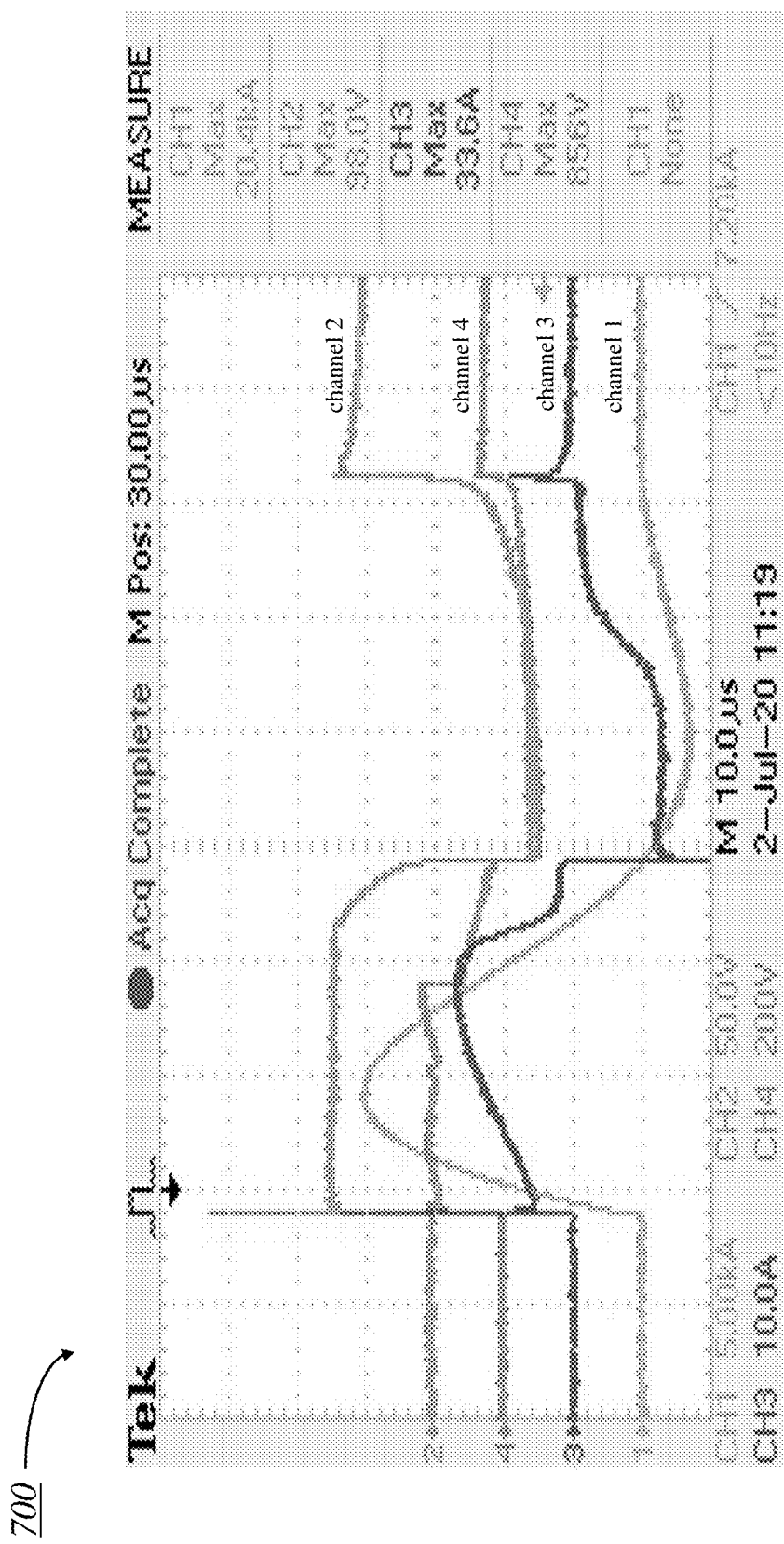

FIG. 7 is a response waveform 700 showing the surge test results for test 3 (20 kA 8/20 surge test) on the circuit 200B (FIG. 2B), in accordance with exemplary embodiments. Numbers on the left side of the waveform 700 denote the channels of the resulting waveforms produced (channels 1, 2, 3, and 4). Channel 1 shows the surge current through a DC60 GDT 210. Channel 2 shows the surge current through a 5KPA60CA TVS diode 220, with Vc=98V. Channel 3 shows the surge current through a 5KPA60CA (<16A) TVS diode 222. Channel 4 shows the voltage through the GDT 210 (856V).

For test 3, the D MOSFETs 224 and 226 are IXTT10N100D2, manufactured by Littelfuse®. Relative to tests 1 and 2, the surge waveform of test 3 (20 kA 8/20) is considered a very stressful, fast surge waveform, in one embodiment. The GDT 210 responds to take away some surge energy (channel 4). The let-through energy is then further absorbed by the D MOSFETs 224 and 226. In one embodiment, the ultimate clamping voltage for test 3 is 78V, which is also a very low level, relative to using a traditional inductor. Tests 1 (FIG. 5), 2 (FIG. 6), and 3 (FIG. 7) all demonstrate that the D MOSFET provides a much better clamping voltage than a traditional inductor. If an inductor had been used here, the resulting clamping voltage, even with the TVS diodes, would be in the range of 140-200V or above. Also, the surge current would be increased, say from 10 kA to 20 kA, causing a dramatic rise in the clamping voltage as well. In an exemplary embodiment, the superior clamping characteristics of test 3 is demonstrated even as the surge current increases to up to 20 kA and the clamping voltage of about 78V is maintained no matter how high the incoming surge levels.

Figure 8:
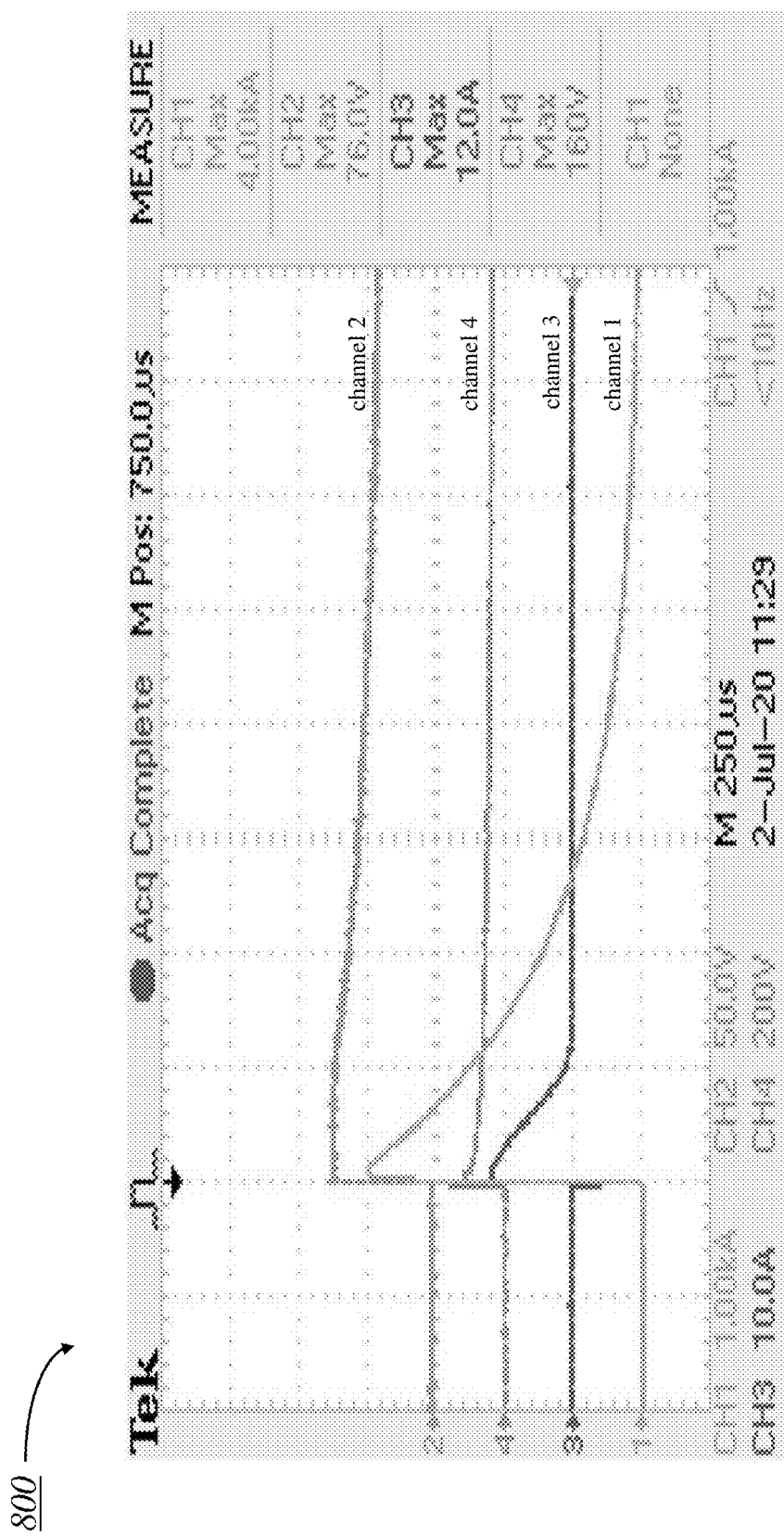

FIG. 8 is a response waveform 800 showing the surge test results for test 4 (4 kA 10/350 surge test) on the circuit 200B (FIG. 2B), in accordance with exemplary embodiments. Numbers on the left side of the waveform 900 denote the channels of the resulting waveforms produced (channels 1, 2, 3, and 4). Channel 1 shows the surge current through a DC60 GDT 210. Channel 2 shows the surge current through a 5KPA60CA TVS diode 220, with Vc=76V. Channel 3 shows the surge current through a 5KPA60CA (<12A) TVS diode 222. Channel 4 shows the voltage through the GDT 210 (160V).

For test 4, the 10/350 surge test is regarded as a long and high energy surge waveform (in other words, slower than the 8/20 waveform of tests 1 and 3, above), which is appropriate for some latest telecom equipment tests and compliance. As illustrated in the waveform 800, the spike voltage appearing in the GDT 210 is at 160V (channel 4). The D MOSFETs 224 and 226 absorb the let-through energy via the GDT 210, and the surge energy is then further clamped by the TVS diodes 220 and 222 (channel 2). The resultant clamping voltage is maintained at 76V (channel 2), in an exemplary embodiment.

In exemplary embodiments, test 3 (waveform 700) and test 4 (waveform 800) show the results of using 1000V D MOSFETs rather than 500V D MOSFETs, and they have very similar clamping voltages. However, in some faster surge environments, the GDT may have the limitation that it is unable to respond quickly so that a very high spike and high voltage surge waveforms are created, exceeding the drain-to-source voltage, $V_{DS}$, rating of the D MOSFETs, which may, in turn, overstress the circuit 200B. A D MOSFET with a higher drain-to-source voltage, $V_{DS}$, can help solve such an issue, in some embodiments, and provide better surge absorption, so that the circuit 200B still provides a low clamping voltage after the TVS diode stage.

Figure 9:
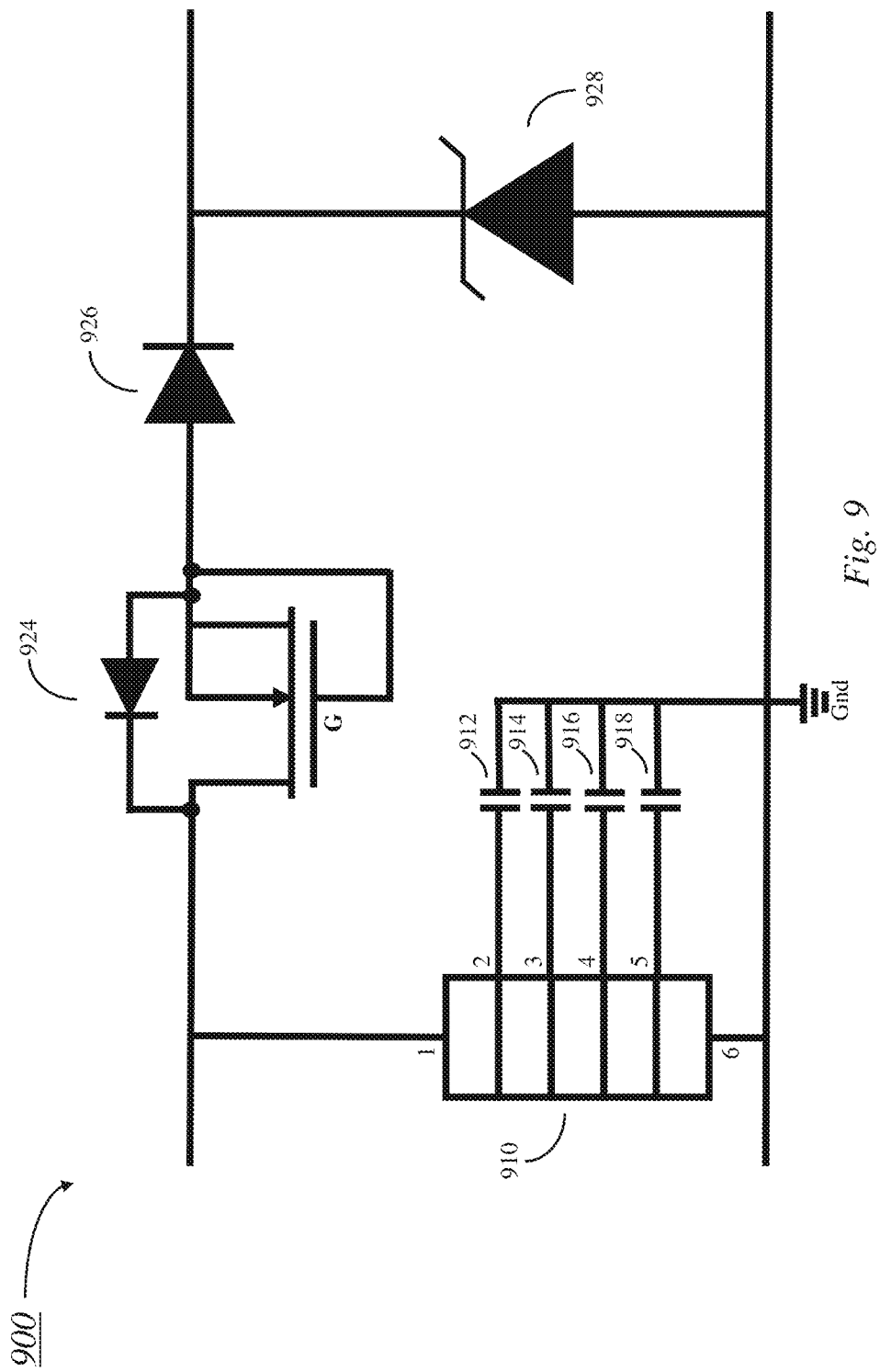
FIG. 9 is a representative drawing of a novel device used for surge protection of a circuit, in accordance with exemplary embodiments.

The circuits 200A, 200B, 300, and 400 may be connected to other downstream circuit elements in order to protect those circuit elements. Further, each of circuits 200A, 200B, 300, and 400 may be implemented as standalone devices to be commercially available for connection to and protection of those circuits, in exemplary embodiments. For example, FIG. 9 shows a device 900 that implements the uni-directional embodiment of circuit 400 (FIG. 4). The device 900 features a GDT 910 with four capacitors 912, 914, 916, and 918, which represent the primary protection stage, a diode 926 and TVS diode 928 to represent the secondary protection stage, and a D MOSFET 924 in between to further clamp down the surge voltage. In other embodiments, the GDT may be replaced with a MOV, a thyristor, or another TVS diode. In still other embodiments, based on the application in which the device offers surge protection, the primary protection stage may be eliminated completely, with no GDT or capacitors being present. By connecting the device 900 to other circuits, the device can provide the surge protection capability described herein. The other circuits 200A, 200B, and 300 can similarly be implemented as devices, in exemplary embodiments.

Figure 10:
FIG. 10 is an image of test results performed on the circuit of FIG. 2B, in accordance with exemplary embodiments.

FIG. 10 is an image 1000 showing information related to test 5 (48V, 3A continuous test) on the circuit 200B (FIG. 2B), in accordance with exemplary embodiments. In test 5, 3A of continuous current was applied to the protection module circuit 200B and, as shown in the image 1000, the D MOSFETs 224 and 226 exhibited a temperature rise in their case (packaging) to around 101° C. In this test, there was no heat sink affixed to the D MOSFETs 224 and 226. Thus, under normal operating conditions, the protection module circuit 200B allows normal operating current to pass through the circuit without protection intervention. In exemplary embodiments, this demonstrates that the D MOSFETs 224 and 226, working in saturation mode, are able to provide current delivery function, which is different from their surge absorption and blocking function under over-surge conditions.

D MOSFET Safe Operating Area (SOA)

In the protection circuit 200B, when the GDT 210 responds to an external surge in current, there is a resultant surge voltage and current passing through the GDT. However, in general, the GDT trigger speed in response to an overvoltage event is slower than that of semiconductor-type overvoltage protectors, such as TVS diodes and other thyristor-type protectors. This is despite the fact that GDTs have a relatively high energy handling capability. In order to have a coordinated current blocking element to absorb more surge energy before going to the secondary protectors, in exemplary embodiments, the D MOSFETs 224 and 226 have the ability to block that level of surge energy following the GDT stage. The Safe Operating Area means that the D MOSFETs 224 and 226 have to withstand the residual energy passing through the GDT safely without exceeding the safe operating area (SOA). In this case, the MOSFET SOA is the minimum operating voltage $V_{DS}$ and current $I_{DS}$ conditions versus time scale. This is normally plotted when different surge waveforms are applied over the MOSFET. Table 1, below, provides more details regarding the SOA of the MOSFET.

Figure 11:
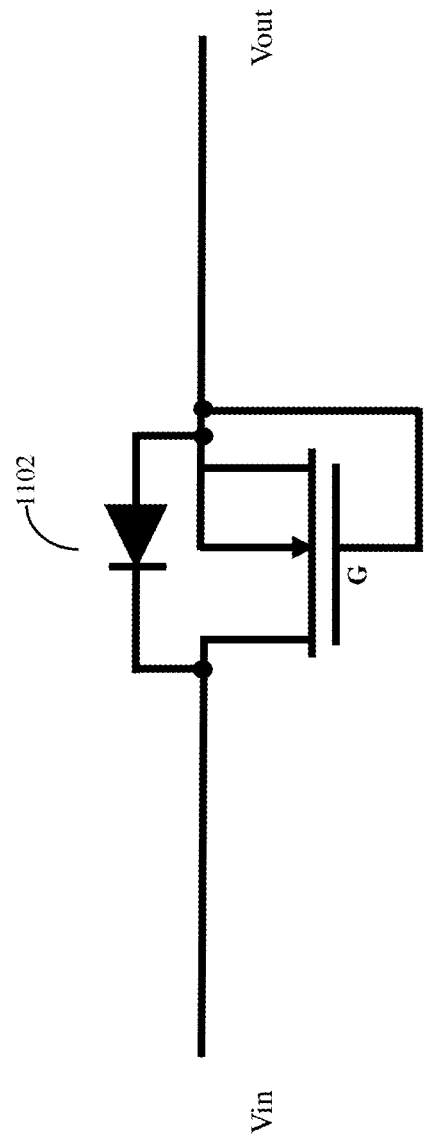
FIG. 11 is a representative drawing of a circuit for testing the D MOSFET standalone surge withstand capability, in accordance with exemplary embodiments.

FIG. 11 is a representative drawing of a circuit 1100 for testing the D MOSFET standalone surge withstand capability, according to exemplary embodiments. The circuit 1100 includes a D MOSFET 1102 to enable the evaluation of a safe operating area (SOA) for a particular waveform. Table 1 shows the results of a current surge for the circuit of FIG. 11, according to exemplary embodiments. In this test, the D MOSFET 1102 is an IXTH10N100D2, manufactured by Littelfuse®, and there is a gate-to-source short of the D MOSFET (SOA). These are surge test results with a dedicated surge waveform and peak voltage (500V, 1000V) to the D MOSFET directly to verify that the D MOSFET can survive with such an input voltage and current condition without chip failure. In the D MOSFET of Table 1, the resultant voltage $V_{DS}$ detected (464V, 1000V) are well within the max $V_{DS}$ as specified in the datasheet, which is 1000V in IXTH10N100D2. Also, the max current $I_{sat}$ can be verified a well with these surge tests.

TABLE 1

Surge result for IXTH10N100D2 D MOSFET

| Test | 1.2/50 μsec | $V_{DS}$ | $I_{sat}$ |
|---|---|---|---|
| #1 | 500 V | 464 V | 19.2 A |
| #2 | 1000 V | 1000 V | 21.6 V |

Table 1 shows that the IXTH10N100D2 D MOSFET can pass the 1000V 1.2/50 μsec surge test safely.

Table 2 shows the results of a current surge for the circuit of FIG. 11, according to exemplary embodiments. In this test, the D MOSFET 1102 is an IXTH10N100D2, manufactured by Littelfuse®, and there is a gate-to-source short of the D MOSFET (SOA).

TABLE 2

Surge result for IXTH10N100D2 D MOSFET

| Test | 10/1000 μsec | $V_{DS}$ | $I_{sat}$ |
|---|---|---|---|
| #1 | 500 V | 400 V | 24 A |
| #2 | 700 V | 620 V | 31.2 V |
| #3 | 700 V | 640 V | 30.4 A |

Table 2 shows that the IXTH10N100D2 D MOSFET can pass the 700V 10/1000 μsec surge test safely.

Table 3 shows the results of a current surge for the circuit of FIG. 11, according to exemplary embodiments. In this test, the D MOSFET 1102 is an IXTH16N50D2, manufactured by Littelfuse®, and there is a gate-to-source short of the D MOSFET.

TABLE 3

Surge result for IXTH16N50D2 D MOSFET

| Test | 1.2/50 μsec | $V_{DS}$ | $I_{sat}$ |
|---|---|---|---|
| #1 | 500 V | 456 V | 24 A |

Table 3 shows that the IXTH16N50D2 D MOSFET can pass the 500V 1.2/50 μsec surge test safely with a maximum saturation current of 24 A.

Table 4 shows the results of a current surge for the circuit of FIG. 11, according to exemplary embodiments. In this test, the D MOSFET 1102 is an IXTH16N50D2, manufactured by Littelfuse®, and there is a gate-to-source short of the D MOSFET.

TABLE 4

Surge result for IXTH16N50D2 D MOSFET

| Test | 10/1000 μsec | $V_{DS}$ | $I_{sat}$ |
|---|---|---|---|
| #1 | 700 V | 448 V | 43.2 A |
| #2 | 700 V | 504 V | 41.6 A |

Table 4 shows that the IXTH16N50D2 D MOSFET can pass the 700V 10/1000 μsec surge test safely with a max saturation of 43.2 A.

Figure 12A:
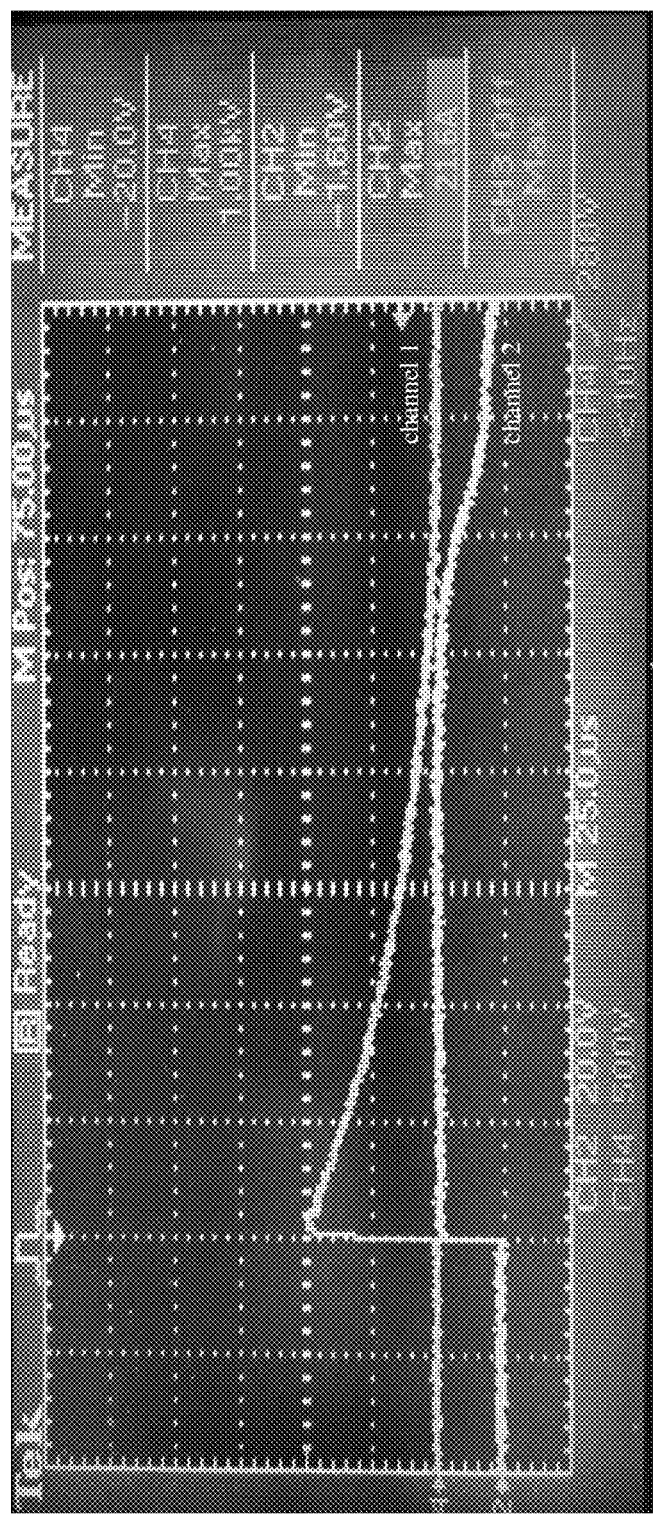
FIGS. 12A and 12B are waveforms illustrating a forward bias D MOSFET response to surge energy and saturation current in a safe operating area, in accordance with exemplary embodiments.
Figure 12B:
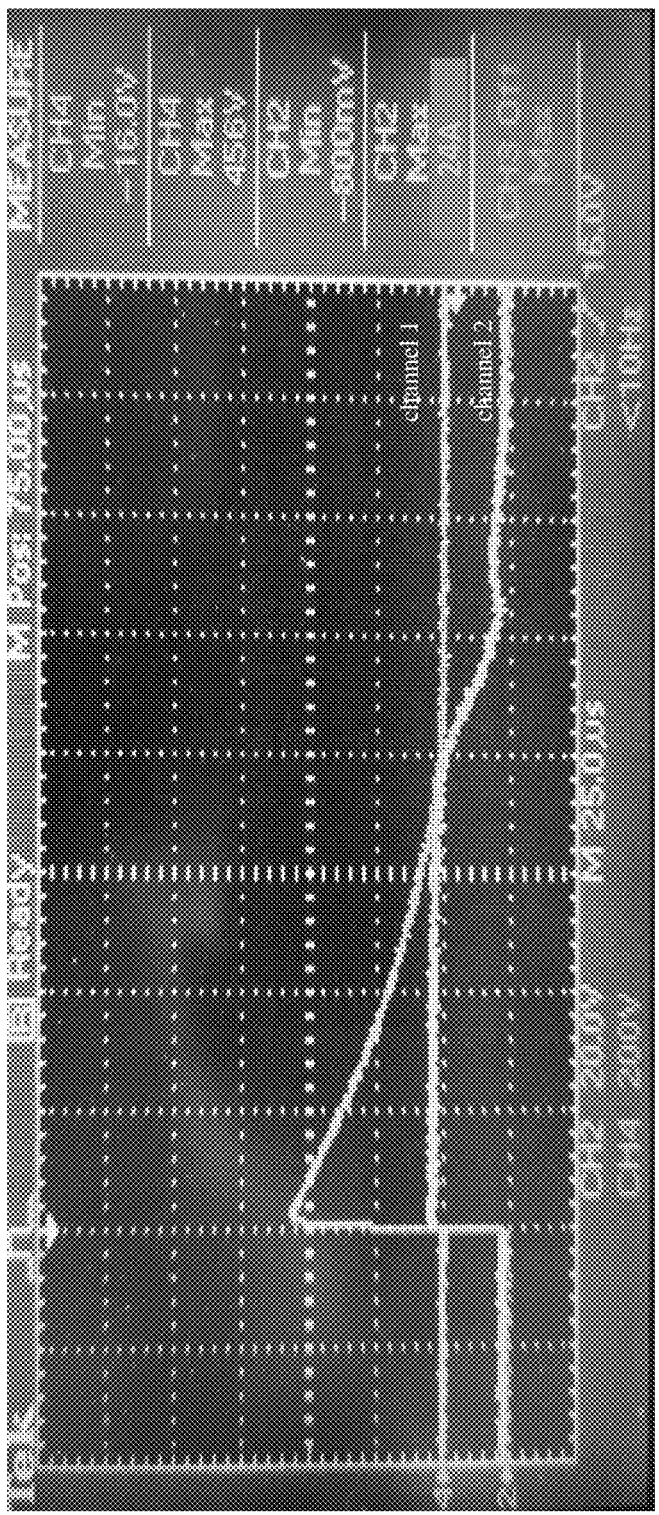

FIGS. 12A and 12B are waveforms illustrating a forward bias D MOSFET response to surge energy and saturation current in a safe operating area for the circuit 400 (FIG. 4) or the device 900 (FIG. 9), in accordance with exemplary embodiments. In the first waveform 1200A, the D MOSFET is a IXTH10N100D2, manufactured by Littelfuse®. In the second waveform 1200B, the D MOSFET is a IXTH16N50D2, also manufactured by Littelfuse®. The waveform 1200A shows the forward biased 1000V D MOSFET saturation current, $I_{sat}$, and drain-to-source voltage, $V_{DS}$, time plot to measure a safe operating area (SOA). The waveform 1200B shows the forward biased 500V D MOSFET saturation current $I_{sat}$, and drain-to-source voltage, $V_{DS}$, time plot to measure a SOA. In both waveforms 1200A and 1200B, the saturation current, $I_{sat}$, is measured with the D MOSFET drain-to-source terminal shorted and surged with 1.2/50 voltage 1 kV surge waveform. The D MOSFET saturation is in a steady state when the D MOSFET is exposed to surge energy and is able to respond to block the surge energy.

Based on the 1.2/50 μs surge test, the 1000V D MOSFET can pass 1000V 21.6 A surge test safely, in exemplary embodiments. To transform the current specification to a power rating, that means the D MOSFET can survive at least 1000V×21.6 A=21.6 kW at 8/20 μs current waveform. (1.2/50 is a voltage waveform. When transformed to a current waveform, it changes to 8/20. Thus, the two notations are the same, but one denotes the voltage waveform while the other denotes the current waveform. By comparison, in 10/1000, both current and voltage waveforms are also 10/1000. These are Telecommunications surge standards defined by UL and IEC.) Thus, in order to pass the above 20 kA surge, the D MOSFET needs to withstand the power rating=(surge voltage passing through GDT-TVS voltage)*$I_{sat}$=(200-98)*16=1.63 kW. This is well below the 21.6 kW value for the D MOSFET.

Similarly, based on the 1.2/50 µs surge test, the 500V D MOSFET can pass 500V 24A surge test safely, in exemplary embodiments. To transform the current specification to a power rating, that means the D MOSFET can survive at least 500V×24A=12 kW at 8/20 µs current waveform. Thus, in exemplary embodiments, the D MOSFET can safely handle such energy levels. The same calculation can be done to estimate the SOA of the D MOSFET in different surge waveforms and conditions, as the energy handling capability of a D MOSFET tends to be similar per wafer area.

In some embodiments, the D MOSFET configurations shown and described herein provide a new way to absorb surge energy to replace traditional wire inductors. Chokes are inductors with a magnetic core, and thus suffer similar drawbacks to inductors. In exemplary embodiments, ultra-low clamping voltage is achieved by using the D MOSFET implementations described herein. Further, in some embodiments, smaller rating secondary protection devices, such as the TVS diode(s) illustrated, can be used to provide a cost-effective solution due to the D MOSFET blocking some of the surge energy before the surge energy reaches the secondary protection stage. In other words, without the D MOSFETs helping to clamp down the surge energy, higher rated TVS diodes would be necessary at the secondary protection stage, in some embodiments.

In exemplary embodiments, fast ramping surges, from mid-energy medium speed surges to high-energy long surges can be absorbed by the D MOSFETs, more effectively than in the prior art. This is because the response time of the D MOSFET is much faster than other passive components, such as inductors.

Further, the GDT used in the primary protection stage of the above circuits is merely an example. The GDT may be replaced by a wide variety of other components, including but not limited to MOVs, TVS diodes, and thyristor protectors. Depending on the applications and surge protection level, it is even possible to use the D MOSFETs for surge protection without the presence of primary protection stages, in some embodiments.

Thus, as shown and described herein, a new protection module circuit is disclosed featuring one or more D MOSFETs. Unlike using traditional inductors, the one or more D MOSFETs provide an excellent capability for blocking and absorption of surge energy, in exemplary embodiments, when part of coordinated protection circuits with multiple stages (primary and secondary). In contrast, inductors are bulky and bring about a high impedance path for high frequency signals and power loss. Using inductors may cause some unwanted overshoot issues and are unable to overcome some fast transient events.

In contrast to the inductor model, the one or more D MOSFETs, as illustrated in the various circuits herein, are able to handle a wide range of different ramp speeds and magnitudes of surge energy levels within its safe operating area. Thus, the D MOSFETs are a good choice for absorbing surge energy, particularly for modern electronics, as the electronic designs demand an ever increasingly sophisticated protection scheme, in exemplary embodiments.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A circuit operable to provide overcurrent protection, the circuit comprising:
   a primary protection device to divert a first portion of an external surge transient coming into the circuit to a ground;
   a secondary protection device to divert a second portion of the external surge transient coming into the circuit to the ground;
   a depletion mode metal oxide semiconductor field effect transistor (D MOSFET) to absorb surge energy in between the primary protection device and the secondary protection device; and
   a second D MOSFET, wherein the D MOSFET and the second D MOSFET provide bi-directional protection.

2. The circuit of claim 1, wherein the primary protection device is a Gas Discharge Tube (GDT).

3. The circuit of claim 1, wherein the primary protection device is a Metal Oxide Varistor (MOV).

4. The circuit of claim 1, wherein the secondary protection device is a Transient Voltage Suppression (TVS) diode.

5. The circuit of claim 1, wherein the secondary protection device is two Transient Voltage Suppression (TVS) diodes.

6. The circuit of claim 1, wherein the D MOSFET provides uni-directional protection.

7. The circuit of claim 1, further comprising third and fourth D MOSFETs.

8. The circuit of claim 1, wherein the D MOSFET and the second D MOSFET are connected in anti-series.

9. The circuit of claim 1, wherein the primary protection device is a first Transient Voltage Suppression (TVS) diode and the secondary protection device is a second TVS diode.

10. A device to be coupled to a circuit, the device operable to provide overcurrent protection to the circuit, the device comprising:
    a primary protection device to divert a first portion of an external surge transient coming into the circuit to a ground;
    a secondary protection device to divert a second portion of the external surge transient coming into the circuit to the ground;
    a depletion mode metal oxide semiconductor field effect transistor (D MOSFET) to block residual surge of the external surge transient that is not fully suppressed by the primary protection device; and
    a second D MOSFET, wherein the D MOSFET and the second D MOSFET provide bi-directional protection.

11. The device of claim 10, wherein the primary protection device is a Gas Discharge Tube (GDT).

12. The device of claim 10, wherein the primary protection device is a Metal Oxide Varistor (MOV).

13. The device of claim 10, wherein the secondary protection device is a Transient Voltage Suppression (TVS) diode.

14. The device of claim 10, wherein the secondary protection device is two Transient Voltage Suppression (TVS) diodes.

15. The circuit of claim 10, wherein the D MOSFET provides uni-directional protection.

16. The device of claim 10, further comprising third and fourth D MOSFETs.

17. The device of claim 10, wherein the D MOSFET and the second D MOSFET are connected in anti-series.

18. The device of claim 10, wherein the primary protection device is a first Transient Voltage Suppression (TVS) diode and the secondary protection device is a second TVS diode.

* * * * *